(12) United States Patent
Kim et al.

(10) Patent No.: US 12,004,406 B2
(45) Date of Patent: Jun. 4, 2024

(54) DISPLAY DEVICE COMPRISING SEE-THROUGH AREA FOR CAMERA

(71) Applicant: LG Display Co., Ltd., Seoul (KR)

(72) Inventors: DongJun Kim, Paju-si (KR); JiChul Lim, Pyeongtaek-si (KR); SungWook Yoon, Goyang-si (KR); KwangMin Hyun, Deagu (KR)

(73) Assignee: LG DISPLAY CO., LTD., Seoul (KR)

( * ) Notice: Subject to any disclaimer, the term of this patent is extended or adjusted under 35 U.S.C. 154(b) by 232 days.

(21) Appl. No.: 17/126,002

(22) Filed: Dec. 17, 2020

(65) Prior Publication Data
US 2021/0193757 A1   Jun. 24, 2021

(30) Foreign Application Priority Data
Dec. 20, 2019   (KR) .................. 10-2019-0171939

(51) Int. Cl.
*H10K 59/65*   (2023.01)
*H10K 50/14*   (2023.01)
(Continued)

(52) U.S. Cl.
CPC ........... *H10K 59/65* (2023.02); *H10K 50/844* (2023.02); *H10K 59/122* (2023.02);
(Continued)

(58) Field of Classification Search
CPC ............. H01L 27/3234; H01L 27/3211; H01L 27/3246; H01L 27/3276; H01L 27/3244; H01L 27/3225; H01L 27/3297; H01L 27/3265; H01L 27/3295; H01L 51/5253; H01L 51/5237; H01L 51/5234; H01L 51/5256; H01L 51/5048; H01L 51/5056; H01L 51/5072; H01L 2251/301; H01L 5/2257; H01L 33/12; H10K 50/844; H10K 50/14; H10K 50/15; H10K 50/16; H10K 50/84; H10K 50/828; H10K 50/8445;
(Continued)

(56) References Cited

U.S. PATENT DOCUMENTS 10,541,380 B1 *   1/2020   Sung ..................... H10K 59/124
10,879,330 B1 *   12/2020   Cui ....................... H10K 59/128
(Continued)

FOREIGN PATENT DOCUMENTS

CN    105575997 A    5/2016
CN    107026190 A    8/2017
(Continued)

OTHER PUBLICATIONS

Chinese Office Action dated Dec. 7, 2023 issued in Patent Application No. 202011458445.6 w/English Translation (14 pages).

*Primary Examiner* — Ida M Soward
(74) *Attorney, Agent, or Firm* — POLSINELLI PC

(57) ABSTRACT

A display device includes a camera see-through area which includes a camera module disposed therein; a routing area which is disposed in the vicinity of the camera see-through area and is bypassed by at least one data line and scan line; and a pixel area which includes the camera see-through area and the routing area and includes a plurality of sub-pixels including an organic light emitting diode and a cathode disposed therein.

19 Claims, 5 Drawing Sheets

(51) Int. Cl.
*H10K 50/15* (2023.01)
*H10K 50/16* (2023.01)
*H10K 50/84* (2023.01)
*H10K 50/844* (2023.01)
*H10K 59/12* (2023.01)
*H10K 59/122* (2023.01)
*H10K 59/13* (2023.01)
*H10K 59/131* (2023.01)
*H10K 59/35* (2023.01)
*H01L 33/12* (2010.01)
*H10K 59/121* (2023.01)
*H10K 102/00* (2023.01)

(52) U.S. Cl.
CPC ........... *H10K 59/131* (2023.02); *H10K 59/35* (2023.02); *H01L 33/12* (2013.01); *H10K 50/14* (2023.02); *H10K 50/15* (2023.02); *H10K 50/16* (2023.02); *H10K 59/1216* (2023.02); *H10K 2102/00* (2023.02)

(58) Field of Classification Search
CPC .... H10K 59/65; H10K 59/122; H10K 59/131; H10K 59/35; H10K 59/1216; H10K 59/12; H10K 59/00; H10K 2102/00
See application file for complete search history.

(56) References Cited

U.S. PATENT DOCUMENTS

| | | | |
|---|---|---|---|
| 2017/0032735 A1* | 2/2017 | Lee | G09G 3/3225 |
| 2017/0338295 A1* | 11/2017 | Lee | G09G 3/3225 |
| 2018/0151660 A1* | 5/2018 | Kim | H10K 59/1213 |
| 2019/0081118 A1* | 3/2019 | Oh | H10K 59/124 |
| 2019/0214596 A1* | 7/2019 | Park | H10K 77/111 |
| 2019/0243427 A1* | 8/2019 | Nakamura | G06F 1/1626 |
| 2019/0392767 A1* | 12/2019 | Kim | G09G 3/20 |
| 2020/0044006 A1* | 2/2020 | Lee | H01L 27/3276 |
| 2020/0083299 A1* | 3/2020 | Kim | H10K 59/126 |
| 2020/0098843 A1* | 3/2020 | Jeon | H01L 27/3258 |
| 2020/0127231 A1* | 4/2020 | Yun | H01L 27/323 |
| 2020/0133415 A1* | 4/2020 | Choi | G06F 3/0412 |
| 2020/0135800 A1* | 4/2020 | Seo | H10K 71/00 |
| 2020/0144352 A1* | 5/2020 | Lee | H01L 27/3248 |
| 2020/0144535 A1* | 5/2020 | Kim | H01L 51/5256 |
| 2020/0159369 A1* | 5/2020 | Seo | G06F 3/0443 |
| 2020/0168850 A1* | 5/2020 | Park | H01L 51/0097 |
| 2020/0173949 A1* | 6/2020 | Lee | G06F 3/04164 |
| 2020/0176542 A1* | 6/2020 | Park | G09G 3/3241 |
| 2020/0176657 A1* | 6/2020 | Jang | G06F 1/1626 |
| 2020/0194714 A1* | 6/2020 | Won | H01L 27/3248 |
| 2020/0235194 A1* | 7/2020 | Ito | H10K 59/121 |
| 2020/0236259 A1* | 7/2020 | Nakamura | H10K 59/65 |
| 2021/0013298 A1* | 1/2021 | Her | H01L 27/3234 |
| 2022/0005920 A1* | 1/2022 | Zha | H01L 27/3286 |
| 2022/0029132 A1* | 1/2022 | Lee | H10K 50/865 |

FOREIGN PATENT DOCUMENTS

| | | |
|---|---|---|
| CN | 107394061 A | 11/2017 |
| CN | 109148381 A | 1/2019 |
| CN | 110021625 A | 7/2019 |
| CN | 110021640 A | 7/2019 |
| CN | 110297365 A | 10/2019 |
| WO | 2018216545 A1 | 11/2018 |

* cited by examiner

DISPLAY DEVICE COMPRISING SEE-THROUGH AREA FOR CAMERA

CROSS-REFERENCE TO RELATED APPLICATION

This application claims the priority of Korean Patent Application No. 10-2019-0171939 filed on Dec. 20, 2019, which is hereby incorporated by reference in its entirety.

BACKGROUND

Field of the Disclosure

The present disclosure relates to a display device, and more particularly, to a display device including a see-through area for camera in a pixel area.

Description of the Background

An image display device which implements various information on a screen is a core technology in an information communication era and is developing to be thinner, lighter, portable, and have higher performance. Therefore, a display device which can reduce a weight and a volume, which are disadvantages of the cathode ray tube (CRT), is in the spotlight.

Examples of the display device include a liquid crystal display (LCD) device, a plasma display panel (PDP), an electroluminescence display (ELD) device, and a micro-LED display (µLED) device.

The display device not only is used for various types of devices such as a TV, a monitor, and a portable phone, but also is being developed by adding a camera, a speaker, and a sensor. However, the camera, the speaker, and the sensor are disposed in a non-pixel area located at an outer periphery of the pixel area so that the display device of the related art has a problem in that the non-pixel area is increased and the pixel area is reduced.

SUMMARY

Accordingly, the present disclosure is directed to a display device comprising see-through area for a camera that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

The present disclosure provides a see-through area for camera in a pixel area which allows the camera to capture images, thereby reducing a non-pixel area. However, when a through hole is formed in a display device to improve a transmittance of a see-through area for camera, moisture may be permeated into a pixel in the vicinity of the see-through area for camera, which causes defects.

When the see-through area for camera overlaps the pixel of the display device, an image capturing quality of the camera may be degraded. Therefore, the present disclosure is to provide a structure of a display device which suppresses the moisture permeation problem while maximizing a transmittance of the see-through area for camera.

Accordingly, in order to solve the above-described problems, the present disclosure is to provide a display device in which a see-through area for camera (hereinafter, simply referred to as "camera see-through area") is optimized.

According to an aspect of the present disclosure, a display device includes: a camera see-through area which includes a camera module disposed therein; a routing area which is disposed in the vicinity of the camera see-through area and is bypassed by at least one data line and scan line; and a pixel area which includes the camera see-through area and the routing area and includes a plurality of sub-pixels including an organic light emitting diode and a cathode disposed therein.

The plurality of sub-pixels may be not disposed in the camera see-through area.

The plurality of sub-pixels may be not disposed in the routing area.

The display device may further include a first inorganic encapsulation layer covering the pixel area, a foreign material cover layer on the first inorganic encapsulation layer and a second inorganic encapsulation layer on the foreign material cover layer.

The second inorganic encapsulation layer may be disposed in the camera see-through area and the routing area to be flat.

The pixel area may include an overcoating layer and a bank-spacer layer and the camera see-through area may not include the overcoating layer and the bank-spacer layer.

The camera see-through area may not include at least the organic light emitting diode.

The camera see-through area may not include at least the cathode.

The cathode may be a translucent electrode.

The pixel area may include an overcoating layer and a bank-spacer layer and the overcoating layer and the bank-spacer layer may extend to the camera see-through area.

According to the present disclosure, a camera see-through area in which a camera module is disposed is disposed in a pixel area so that an area of the non-pixel area may be reduced.

Further, according to the present disclosure, a structure in which a camera see-through area of the display device is sealed is formed so that the moisture permeation of the organic light emitting diode may be suppressed while improving a transmittance. Therefore, moisture or oxygen which may be permeated to the organic light emitting diode may be suppressed or delayed. Furthermore, an area of the camera see-through area in the pixel area may be minimized.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
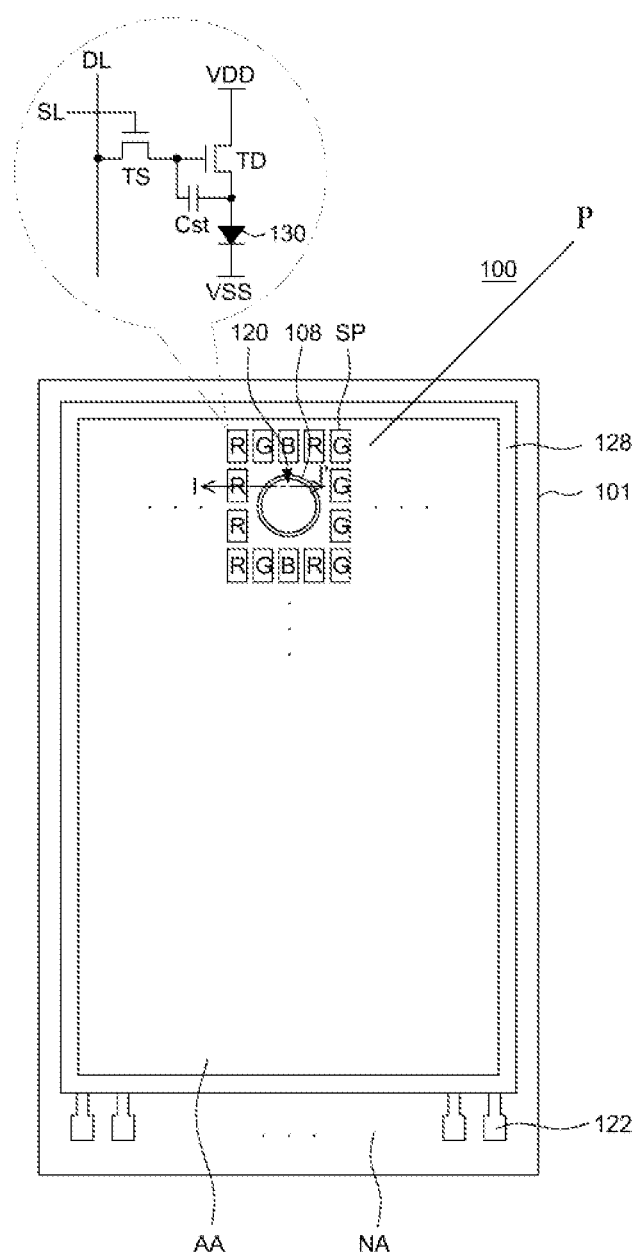
FIG. 1 is a view illustrating a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

A display device 100 according to an exemplary aspect of the present disclosure will be described with reference to FIGS. 1 to 3.

Figure 2:
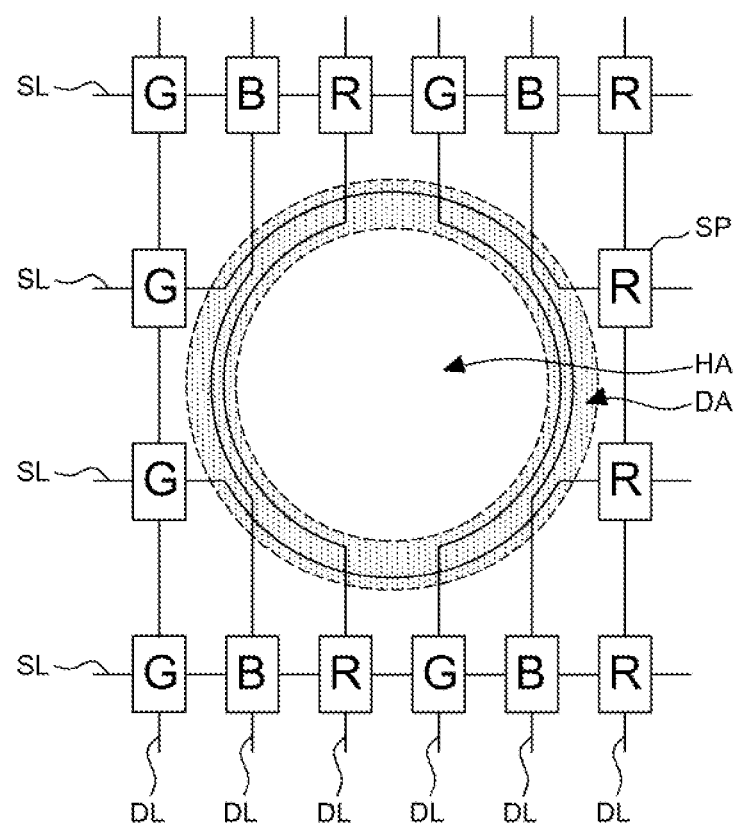
FIG. 2 is a cross-sectional view of a display device taken along the line I-I' of FIG. 1.
Figure 3:
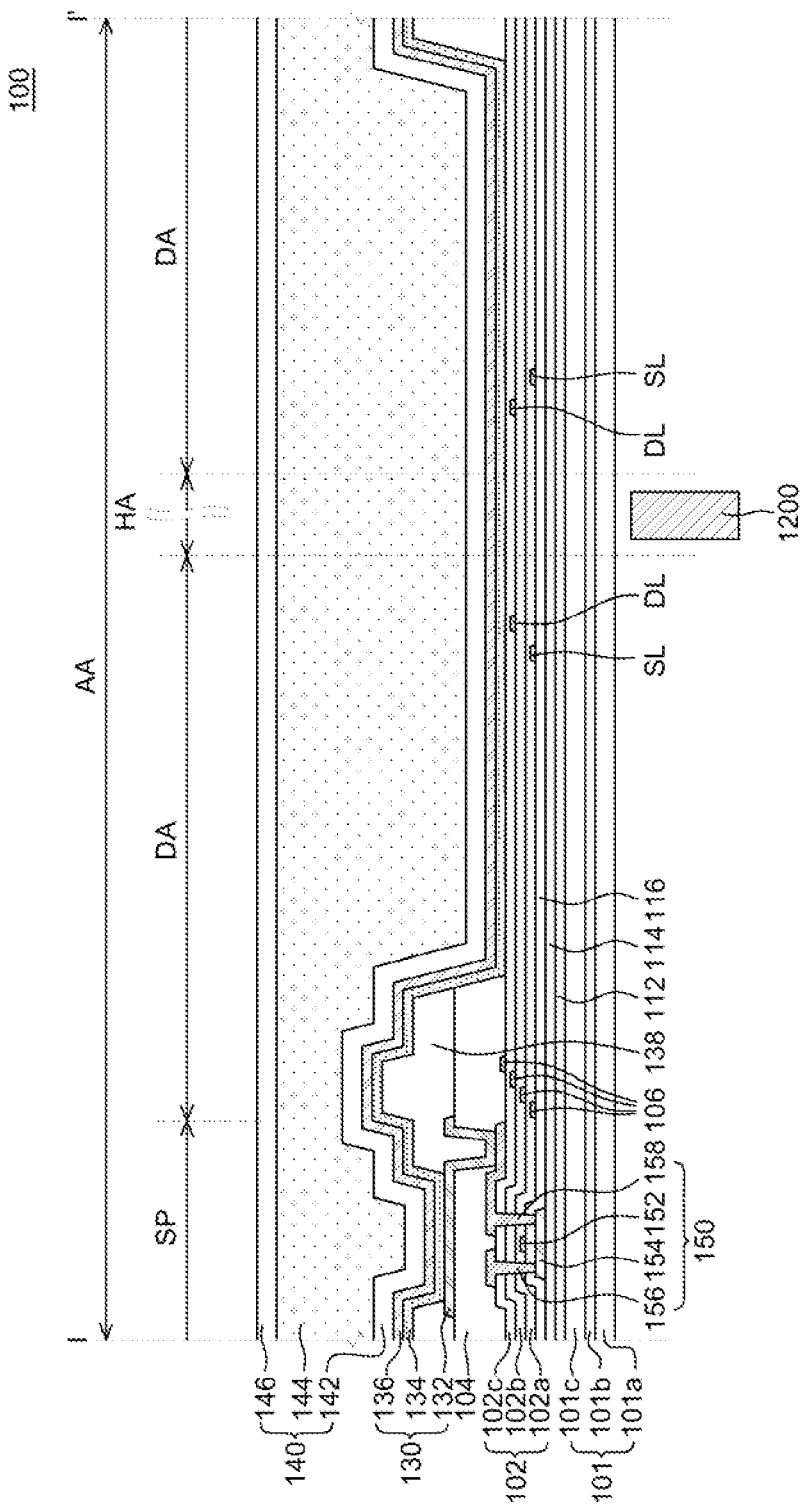
FIG. 3 is a cross-sectional view of a display device according to an exemplary aspect of the present disclosure.

The display device 100 illustrated in FIGS. 1 to 3 includes a pixel area AA and a non-pixel area NA. In the pixel area AA, a camera see-through area HA and a routing area DA between the camera see-through area HA and the pixel area AA.

In the non-pixel area NA, a plurality of pads 122 which supplies a driving signal to each of a plurality of signal lines 106 disposed in the pixel area AA is formed. Here, the signal lines 106 may include at least one of a scan line SL, a data line DL, a high-potential voltage (VDD) supply line and a low-potential voltage (VSS) supply line.

Since the camera see-through area HA is disposed in the pixel area AA, the camera see-through area HA may be enclosed by a plurality of sub-pixels SP disposed in the pixel area AA. The camera see-through area HA is illustrated to have a circular shape, but is not limited thereto and may be formed to have a polygonal or an elliptical shape. That is, the shape of the camera see-through area HA may be determined depending on a shape of a corresponding sensor module. For example, in the camera see-through area HA, a normal camera and a pantoscopic camera may be simultaneously disposed. In this case, the camera see-through area HA may have an elliptical shape.

Referring to FIG. 2, the routing area DA is disposed along an outside of the camera see-through area HA in the pixel area AA. In the routing area DA, at least a scan line SL and a data line DL may be disposed. The scan line SL and the data line DL in the routing area DA may be disposed at the outside of a viewing angle of the camera module 1200. In this case, an image capturing quality of the camera module 1200 may not be degraded.

The routing area DA is an area around which the scan line SL and the data line DL bypass to improve an aperture ratio of the camera see-through area HA. That is, in the camera see-through area HA, the sub-pixel SP and the signal line 106 may not be formed. Therefore, the transmittance of the camera see-through area HA may be improved.

The sub-pixel SP is configured to include a light emitting diode 130. The sub-pixel SP may include a light emitting diode 130 and a pixel driving circuit which independently drives the light emitting diode 130. Hereinafter, an organic light emitting diode will be described as an example of the light emitting diode 130.

The pixel driving circuit may include a switching transistor TS, a driving transistor TD, and a storage capacitor Cst.

When a scan pulse is supplied to the scan line SL, the switching transistor TS is turned on to supply a data signal, which is supplied to the data line DL, to the storage capacitor Cst and a gate electrode of the driving transistor TD.

The driving transistor TD controls a current supplied from the high-potential voltage VDD supply line to the light emitting diode 130 in response to the data signal supplied to the gate electrode of the driving transistor TD to control a luminance of the light emitting diode 130. However, even though the switching transistor TS is turned off, the driving transistor TD supplies a current by a voltage charged in the storage capacitor Cst so that the light emitting diode 130 may maintain an emission state.

As illustrated in FIG. 3, the transistor 150 includes an active layer 154 disposed on an active buffer layer 114, a gate electrode 152 overlapping the active layer 154 with a gate insulating layer 116 interposed therebetween, and a source electrode 156 and a drain electrode 158. The source electrode 156 and the drain electrode 158 are formed on a multilayered interlayer insulating layer 102 to be in contact with the active layer 154. However, the transistor 150 is not limited thereto and the active buffer layer 114 may be omitted if necessary.

The active layer 154 may be formed of at least any one of an amorphous semiconductor material, a polycrystalline semiconductor material, and an oxide semiconductor material. The active layer 154 may include a channel region, a source region, and a drain region. The channel region overlaps the gate electrode 152 with the gate insulating layer 116 interposed therebetween to form a channel region between the source electrode 156 and the drain electrode 158. The source region of the active layer 154 is electrically connected to the source electrode 156 through a contact hole which passes through the gate insulating layer 116 and a multilayered interlayer insulating layer 102. The drain region of the active layer 154 is electrically connected to the drain electrode 158 through a contact hole which passes through the gate insulating layer 116 and the multilayered interlayer insulating layer 102.

A multi-buffer layer 112 is included between the active layer 154 and the substrate 101. The multi-buffer layer 112 delays the diffusion of moisture and/or oxygen which permeates the substrate 101. The active buffer layer 114 which may be disposed on the multi-buffer layer 112 protects the active layer 154 and blocks various types of defects introduced from the substrate 101.

The substrate 101 may be, for example, formed of a first polyimide substrate 101a, a substrate insulating layer 101b, and a second polyimide substrate 101c, but is not limited thereto. The active buffer layer 114 and the gate insulating layer 116 may be formed of SiOx to suppress the diffusion of hydrogen to the active layer but is not limited thereto.

At least one of the multi-buffer layer 112, the active buffer layer 114, and the substrate 101 may be formed with a multilayered structure. The active buffer layer 114, the multi-buffer layer 112, the gate insulating layer 116, and the multilayered interlayer insulating layer 102 may be formed of inorganic insulating layers having an excellent moisture blocking performance. For example, the gate insulating layer 116, the active buffer layer 114, the multi-buffer layer 112, and the multilayered interlayer insulating layer 102 may be formed of any one of SiNx and SiOx.

The plurality of signal lines 106 may be formed of a metal layer which is the same as a metal layer which forms the transistor 150 and the storage capacitor Cst. A plurality of signal lines 106 is provided on the gate insulating layer 116 and the multilayered interlayer insulating layer 102 so that it is possible to design a high resolution panel. Further, the plurality of signal lines 106 is patterned to form a storage capacitor Cst.

The multilayered interlayer insulating layer 102 may include a first interlayer insulating layer 102a, a second interlayer insulating layer 102b, and a third interlayer insulating layer 102c, but it is not limited thereto. The number of interlayer insulating layers 102 may vary to be two layers or four or more layers depending on the panel design.

Specifically, the multi-buffer layer 112 extends to the routing area DA and the camera see-through area HA so that the permeation of the oxygen and moisture through the camera see-through area HA and the routing area DA may be blocked. A visible ray transmittance of the multi-buffer layer 112 may be at least 80%. Therefore, even though the camera module 1200 is disposed in the camera see-through area HA, the multi-buffer layer 112 may substantially suppress degradation of a quality of the captured image.

Further, when the multi-buffer layer 112 and the multilayered interlayer insulating layer 102 are formed in the camera see-through area HA to be flat, an unnecessary distortion of an image may be removed. Therefore, the degradation of the image capturing quality of the camera module 1200 may be suppressed. That is, unnecessary distortion may be minimized.

The plurality of signal lines 106 may be formed to have a single layer or a multi-layered structure including Al, Ag, Cu, Pb, Mo, Ti, or an alloy thereof. The scan line SL and the data line DL may be some of the plurality of signal lines.

The light emitting diode 130 includes an anode 132 connected to the drain electrode 158 of the transistor 150, at least one organic light emitting diode 134 formed on the anode 132, and a cathode 136 formed on the organic light emitting diode 134 so as to be connected to the low voltage (VSS) supply line. Here, the low voltage (VSS) supply line supplies a voltage VSS which is relatively lower than a high voltage VDD. The cathode 136 may be a translucent electrode having a visible ray transmittance of 30% to 60%.

The anode 132 is electrically connected to the drain electrode 158 of the transistor 150 which is exposed through a pixel contact hole which passes through the overcoating layer 104 disposed on the transistor 150. Here, the transistor 150 may be a driving transistor TD. The anode 132 of each sub-pixel SP is disposed on the overcoating layer 104 so as to be exposed by a bank-spacer layer 138. The overcoating layer 104 may be referred to as a planarization layer. The bank-spacer layer 138 may refer to a layer configured to perform a function of a bank and/or a spacer and may be formed such that a height difference between the bank and the spacer is generated by a half-tone exposure process, but is not limited thereto.

When the anode 132 is applied to a bottom emission type electroluminescent display device, the anode 132 is formed of a transparent conductive layer such as indium-tin-oxide (ITO) or indium-zinc-oxide (IZO). Further, when the anode 132 is applied to a top emission type electroluminescent display device, the anode 132 is formed with a multilayered structure including a transparent conductive layer and an opaque conductive layer having a high reflection efficiency. The transparent conductive layer is formed of a material having a relatively high work function, such as indium-tin-oxide (ITO) or indium-zinc-oxide (IZO) and the opaque conductive layer is formed with a single or multilayered structure including Al, Ag, Cu, Pb, Mo, Ti, or an alloy thereof. For example, the anode 132 may be formed to have a structure in which a transparent conductive layer, an opaque conductive layer, and a transparent conductive layer are sequentially laminated.

The organic light emitting diode 134 may be formed such that a hole transport layer, an emission layer, and an electron transport layer are laminated on the anode 132 in this order or a reverse order. The organic light emitting diode 134 may include a common layer formed on the entire surface of the pixel area AA and an emission layer which is patterned only on the anode 132 to express a color of a specific sub-pixel SP.

The cathode 136 is formed on an upper surface and a side surface of the organic light emitting diode 134 and the bank-spacer layer 138 so as to be opposite to the anode 132 with the organic light emitting diode 134 interposed therebetween.

An encapsulation unit 140 blocks moisture or oxygen from being permeated into the light emitting diode 130 which is vulnerable to the moisture or oxygen from the outside. To this end, the encapsulation unit 140 includes a plurality of inorganic encapsulation layers 142 and 146 and a foreign material cover layer 144 disposed between the inorganic encapsulation layers 142 and 146 and the inorganic encapsulation layer 146 is disposed on a top layer. For example, the encapsulation unit 140 may be configured to include at least one inorganic encapsulation layer and at least one foreign material cover layer. In the present specification, a structure of the encapsulation unit 140 in which the foreign material cover layer 144 is disposed between the first and second inorganic encapsulation layers 142 and 146 will be described as an example, but it is not limited thereto.

The first inorganic encapsulation layer 142 is formed on the cathode 136. The first inorganic encapsulation layer 142 is formed of an inorganic encapsulation material on which low-temperature deposition is allowed, such as silicon nitride SiNx, silicon oxide SiOx, silicon oxynitride SiON, or aluminum oxide $Al_2O_3$. Therefore, since the first inorganic encapsulation layer 142 is deposited under a low-temperature atmosphere, the organic light emitting diode 134 which is vulnerable to a high-temperature atmosphere may be protected during a deposition process of the first inorganic encapsulation layer 142.

The second inorganic encapsulation layer 146 is formed to cover an upper surface and a side surface of the foreign material cover layer 144 and a top surface of the first inorganic encapsulation layer 142 which is exposed to the foreign material cover layer 144. The top surface, the bottom surface, and the side surface of the foreign material cover layer 144 are sealed by the first and second inorganic encapsulation layers 142 and 146. Therefore, the permeation of the moisture or oxygen from the outside into the foreign material cover layer 144 or the permeation of the moisture or oxygen in the foreign material cover layer 144 into the light emitting diode 130 is minimized or blocked. The second inorganic encapsulation layer 146 is formed of an inorganic insulating material, such as silicon nitride SiNx, silicon oxide SiOx, silicon oxynitride SiON, or aluminum oxide $Al_2O_3$.

The foreign material cover layer 144 serves as a buffer for alleviating a stress between layers caused when the electroluminescent display device is bent and enhances a planarization performance. Further, the foreign material cover layer 144 is formed to have a larger thickness than that of the inorganic encapsulation layers 142 and 146 to suppress cracks from being caused by the foreign material. The foreign material cover layer 144 is formed of an organic insulating material, such as acrylic resin, epoxy resin, polyimide, polyethylene, or silicon oxy carbide SiOC.

When the foreign material cover layer 144 is formed, an external dam 128 may be formed to restrict mobility of the foreign material cover layer 144, but is not limited thereto.

The external dam 128 is formed so as to completely enclose the pixel area AA in which sub-pixels SP that constitute a pixel P are disposed, as illustrated in FIG. 1, or formed between the pixel area AA and the non-pixel area NA. When the non-pixel area NA in which the plurality of pads 122 is disposed is disposed at one side of the substrate 101, the external dam 128 may be disposed only on one side of the substrate 101. When the non-pixel area NA in which the plurality of pads 122 is disposed is disposed on both sides of the substrate 101, the external dam 128 may be disposed on both sides of the substrate 101. When a plurality of external dams 128 is disposed, the external dams 128 are disposed to be spaced apart from each other with a predetermined interval. Therefore, when the foreign material cover layer 144 overflows one external dam 128, another external dam which is spaced apart therefrom may additionally block the overflowing foreign material cover layer 144. Various structures of the external dams 128 described above may block the foreign material cover layer 144 from being spread to the non-pixel area NA.

The foreign material cover layer 144 is configured to entirely cover the camera see-through area HA and the routing area DA. Accordingly, when the top surface of the foreign material cover layer 144 and the second inorganic encapsulation layer 146 are formed in the camera see-through area HA and the routing area DA to be flat, an unnecessary distortion of an image may be removed. Therefore, the degradation of the image capturing quality of the camera module 1200 may be suppressed. That is, unnecessary distortion may be minimized.

A visible ray transmittance of the encapsulation unit 140 may be at least 80%. Therefore, even though the camera module 1200 is disposed in the camera see-through area HA, the encapsulation unit 140 may substantially suppress the degradation of the quality of the captured image, but is not limited thereto.

An area other than the camera see-through area HA includes a part of the overcoating layer 104 and the bank-spacer layer 138 and the camera see-through area HA does not include the overcoating layer 104 and the bank-spacer layer 138. According to the above description, the number of insulating layers disposed in the camera see-through area HA may be reduced. Specifically, when refractive indices of the respective insulating layers are different from each other, unnecessary refraction may occur, which may degrade the image capturing quality of the camera module 1200. However, the overcoating layer 104 and the bank-spacer layer 138 are patterned in the camera see-through area HA so that the image capturing quality may be improved.

Figure 4:
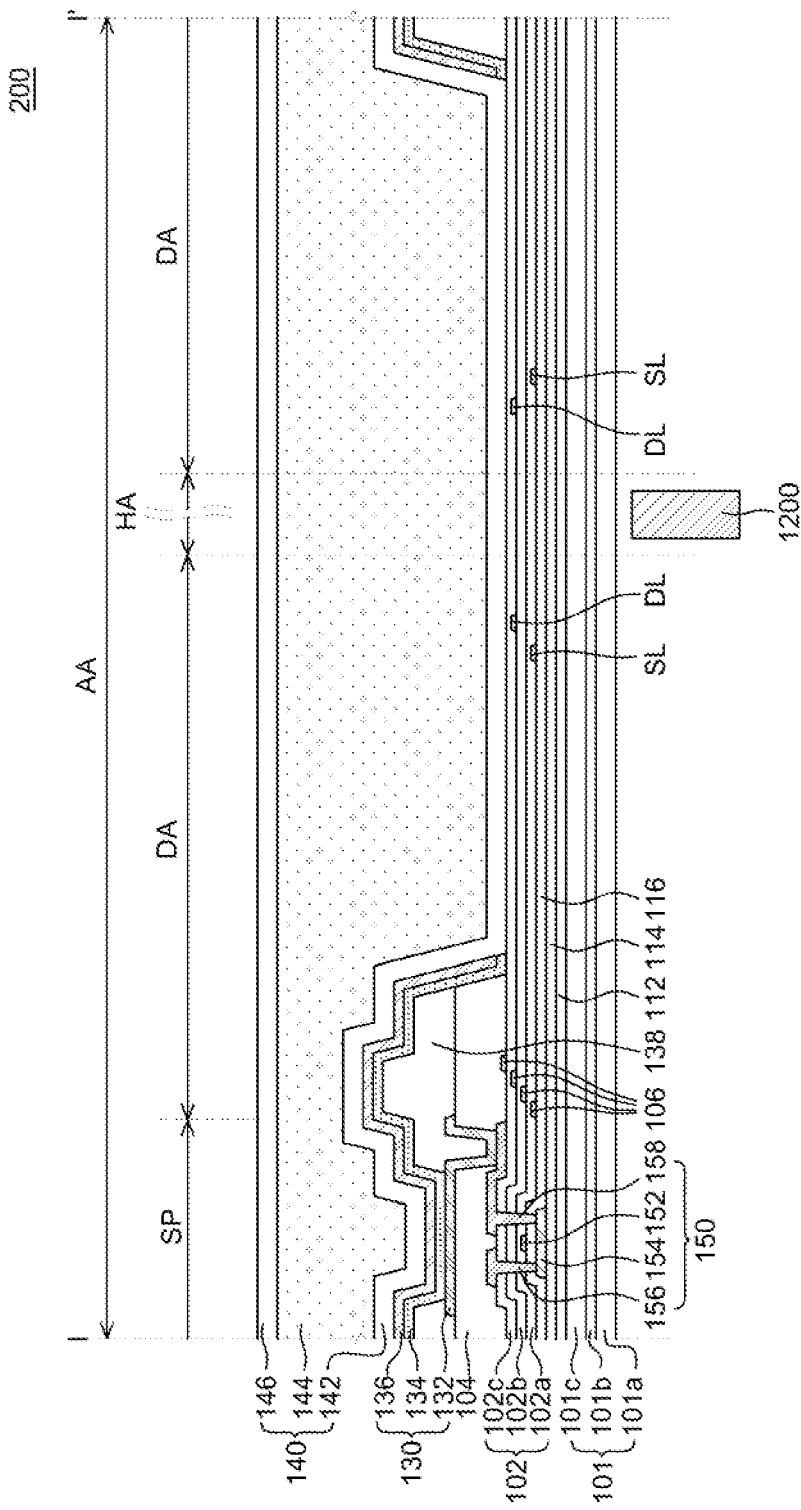
FIG. 4 is a cross-sectional view of a display device according to another exemplary aspect of the present disclosure.

A display device 200 according to another exemplary aspect of the present disclosure will be described with reference to FIG. 4.

The display device 200 according to another exemplary aspect of the present disclosure is substantially the same as the display device 100 according to the exemplary aspect of the present disclosure except that an organic light emitting diode 134 and the cathode 136 are patterned in at least the camera see-through area HA. Therefore, for the convenience of description, a redundant description will be omitted below.

In the display device 200 according to another exemplary aspect of the present disclosure, the organic light emitting diode 134 and the cathode 136 are not disposed in at least the camera see-through area HA. The organic light emitting diode 134 and the cathode 136 are not disposed in at least a part of the routing area DA. The organic light emitting diode 134 and the cathode 136 may be patterned by the mask design.

As described above, the cathode 136 may be a translucent electrode having a visible ray transmittance of 30% to 60%. Specifically, when the cathode 136 has a translucent characteristic, a micro-cavity effect which improves the luminance of the sub-pixel SP may be provided. However, the cathode 136 which is disposed in the camera see-through area HA may degrade the transmittance of the camera see-through area HA and degrade an image capturing quality of the camera module 1200 in accordance with the reflection.

The organic light emitting diode 134 is vulnerable to the permeation of the moisture and oxygen and may serve as a moisture permeation path. When the organic light emitting diode 134 is patterned in the camera see-through area HA to be removed, the moisture permeation path is removed so that the reliability of the display device 200 against the moisture and oxygen may be improved.

In other words, when the organic light emitting diode 134 and the cathode 136 are not simultaneously disposed in the camera see-through area HA, the encapsulation unit 140 and the multilayered interlayer insulating layer 102 may be directly sealed. Therefore, the moisture permeation possibility to the camera see-through area HA may be further reduced.

In other words, the area where the organic light emitting diode 134 and the cathode 136 are patterned may not overlap the viewing angle of the camera module 1200. The viewing angle of the camera module 1200 may vary and an area to be patterned may be set depending on the viewing angle.

Figure 5:
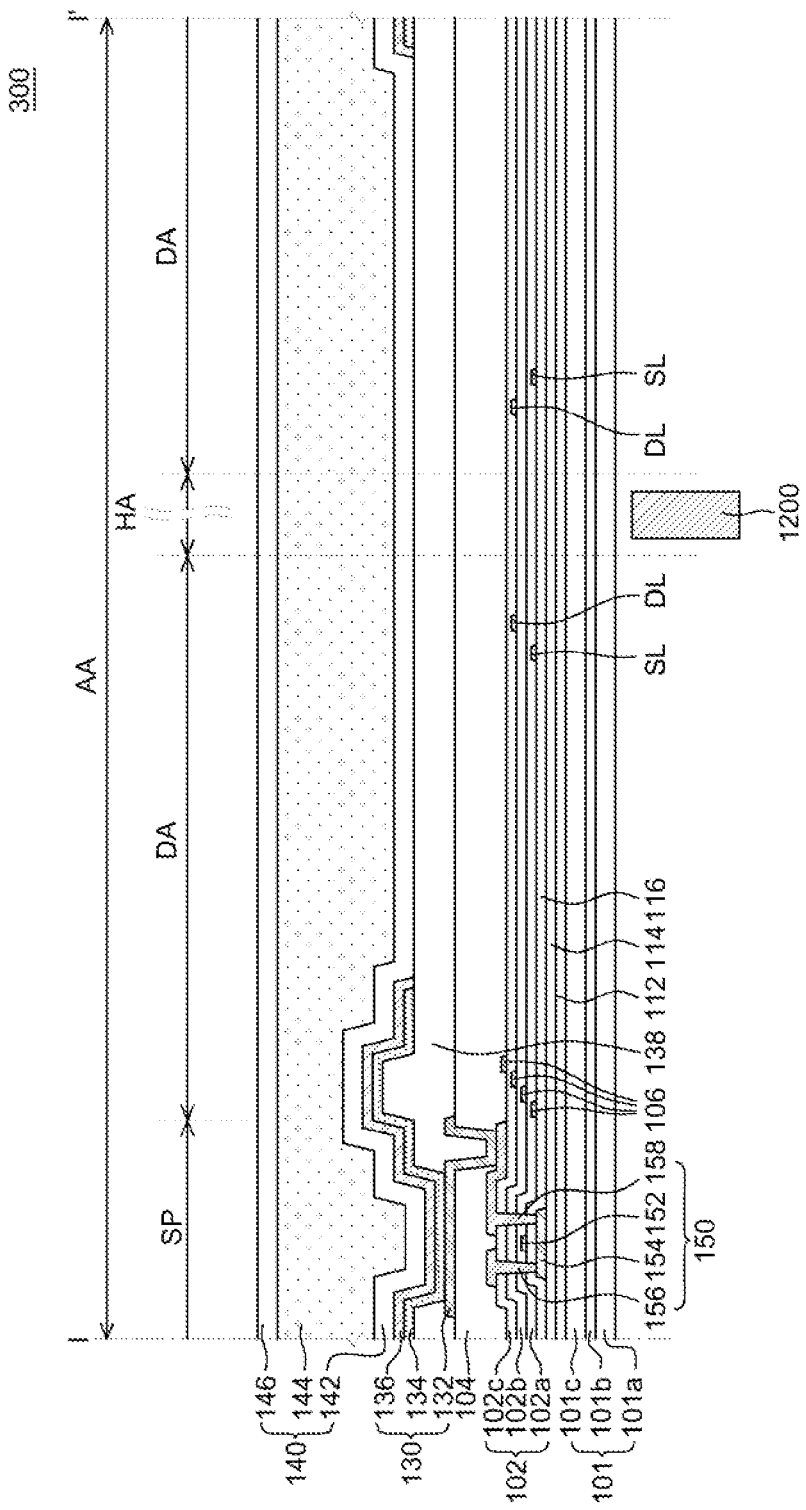
FIG. 5 is a cross-sectional view of a display device according to still another exemplary aspect of the present disclosure.

A display device 300 according to still another exemplary aspect of the present disclosure will be described with reference to FIG. 5.

The display device 300 according to still another exemplary aspect of the present disclosure is substantially the same as the display device 200 according to another exemplary aspect of the present disclosure except that the overcoating layer 104 and the bank-spacer layer 138 extend to the camera see-through area HA. Therefore, for the convenience of description, a redundant description will be omitted below.

In the display device 300 according to still another exemplary aspect of the present disclosure, the overcoating layer 104 and the bank-spacer layer 138 extend to the camera see-through area HA.

According to the above-described configuration, a thickness of the encapsulation unit 140 may be reduced in the camera see-through area HA and the routing area DA.

Specifically, the longer the distance between the first inorganic encapsulation layer 142 and the second inorganic encapsulation layer 146, the larger the thickness of the foreign material cover layer 144 in the camera see-through area HA and the lower the degree of flatness of the top surface of the foreign material cover layer 144. For example, when the viscosity of the foreign material cover layer 144 is high, the top surface of the foreign material cover layer 144 in the camera see-through area HA may be concave.

However, as the overcoating layer 104 and the bank-spacer layer 138 extend to the routing area DA and the camera see-through area HA, the thickness of the encapsulation unit 140 is reduced so that the degree of flatness of the top surface of the encapsulation unit 140 may be improved.

Some of the various exemplary aspects disclosed in the present disclosure may be selectively combined to be carried out.

The exemplary aspects of the present disclosure can also be described as follows:

According to an aspect of the present disclosure, there is provided a display device. The display device includes a camera see-through area which includes a camera module disposed therein, a routing area which is disposed in the vicinity of the camera see-through area and is bypassed by at least one data line and scan line, and a pixel area which includes the camera see-through area and the routing area and includes a plurality of sub-pixels including an organic light emitting diode and a cathode disposed therein.

The plurality of sub-pixels may be not disposed in the camera see-through area.

The plurality of sub-pixels may be not disposed in the routing area.

The display device may further include a first inorganic encapsulation layer covering the pixel area, a foreign material cover layer on the first inorganic encapsulation layer and a second inorganic encapsulation layer on the foreign material cover layer.

The second inorganic encapsulation layer may be disposed in the camera see-through area and the routing area to be flat.

The pixel area may include an overcoating layer and a bank-spacer layer and the camera see-through area may not include the overcoating layer and the bank-spacer layer.

The camera see-through area may not include at least the organic light emitting diode.

The camera see-through area may not include at least the cathode.

The cathode may be a translucent electrode.

The pixel area may include an overcoating layer and a bank-spacer layer and the overcoating layer and the bank-spacer layer may extend to the camera see-through area.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a camera see-through area in which a camera module is disposed below;
    a routing area through which at least one data line and one scan line bypass and disposed in a vicinity of the camera see-through area;
    a pixel area including the camera see-through area, the routing area and a plurality of sub-pixels that has an anode, an organic light emitting element and a cathode disposed therein; and
    at least one interlayer insulating layer disposed in the plurality of sub-pixels and extending to the camera see-through area,
    wherein at least one of the organic light emitting element and the cathode extends to the routing area that surrounds the camera see-through area, and
    wherein the at least one of the organic light emitting element and the cathode extended to the routing area extends with a same continuous contour throughout the routing area and the camera see-through area.

2. The display device according to claim 1, wherein the plurality of sub-pixels is not disposed in the camera see-through area.

3. The display device according to claim 2, wherein the plurality of sub-pixels is not disposed in the routing area.

4. The display device according to claim 1, further comprising:
    a first inorganic encapsulation layer covering the pixel area;
    a foreign material cover layer on the first inorganic encapsulation layer; and
    a second inorganic encapsulation layer on the foreign material cover layer.

5. The display device according to claim 4, wherein the second inorganic encapsulation layer is disposed in the camera see-through area and the routing area to be flat.

6. The display device according to claim 1, wherein the plurality of sub-pixels further includes an overcoating layer and a bank-spacer layer, and wherein the camera see-through area does not include the overcoating layer and the bank-spacer layer.

7. The display device according to claim 1, wherein the camera see-through area does not include the organic light emitting element.

8. The display device according to claim 1, wherein the camera see-through area does not include the cathode.

9. The display device according to claim 8, wherein the cathode is a translucent electrode.

10. The display device according to claim 1, wherein the plurality of sub-pixels further includes an overcoating layer and a bank-spacer layer, and wherein the overcoating layer and the bank-spacer layer are extended to the camera see-through area.

11. A display device, comprising:
a substrate partitioned into a camera see-through area, a routing area disposed in a vicinity of the camera see-through area, and a plurality of sub-pixels that has an anode, an organic light emitting element and a cathode disposed therein;
a plurality of data lines and scan lines crossing one another, at least one data line and one scan line bypassing the routing area;
a camera module disposed below the camera see-through area;
at least one interlayer insulating layer disposed in the plurality of sub-pixels and extending to the camera see-through area;
a first inorganic encapsulation layer covering the plurality of sub-pixels; and
a foreign material cover layer disposed on the first inorganic encapsulation layer,
wherein at least one of the organic light emitting element and the cathode extends to the routing area that surrounds the camera see-through area, and
wherein the at least one of the organic light emitting element and the cathode extended to the routing area extends with a same continuous contour throughout the routing area and the camera see-through area.

12. The display device according to claim 11, further comprising a second inorganic encapsulation layer disposed on the foreign material cover layer.

13. The display device according to claim 11, wherein the second inorganic encapsulation layer is disposed to be flat in the camera see-through area and the routing area.

14. The display device according to claim 11, further comprising an overcoating layer and a bank-spacer layer.

15. The display device according to claim 14, wherein the camera see-through area does not include the overcoating layer and the bank-spacer layer.

16. The display device according to claim 11, wherein the camera see-through area does not include an organic light emitting element.

17. The display device according to claim 11, wherein the camera see-through area does not include a cathode.

18. The display device according to claim 17, wherein the cathode includes a translucent electrode.

19. The display device according to claim 11, further comprising an overcoating layer and a bank-spacer layer in the plurality of sub-pixels, wherein the overcoating layer and the bank-spacer layer are extended to the camera see-through area.

* * * * *